(12) United States Patent
Wakayama et al.

(10) Patent No.: US 7,256,474 B2
(45) Date of Patent: Aug. 14, 2007

(54) SEMICONDUCTOR DEVICE HAVING A GUARD RING

(75) Inventors: Shigetoshi Wakayama, Kawasaki (JP);
Mutsuaki Kai, Kawasaki (JP);
Hiroyuki Kato, Kawasaki (JP); Masato Suga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/777,189

(22) Filed: Feb. 13, 2004

(65) Prior Publication Data

US 2004/0188843 A1    Sep. 30, 2004

(30) Foreign Application Priority Data

Mar. 27, 2003    (JP)    ............................. 2003-088139

(51) Int. Cl.
*H01L 23/544*    (2006.01)
(52) U.S. Cl. ................ 257/620; 257/758; 257/E23.145
(58) Field of Classification Search ................ 257/620, 257/758, 759, 760, 774, 211, E23.145, E23.17, 257/E23.18
See application file for complete search history.

(56) References Cited

U.S. PATENT DOCUMENTS

| 6,399,897 B1 * | 6/2002 | Umematsu et al. ......... 174/261 |
| 2005/0082577 A1 * | 4/2005 | Usui .......................... 257/211 |

FOREIGN PATENT DOCUMENTS

JP    2-123753    5/1990

* cited by examiner

*Primary Examiner*—Hoai Pham
(74) *Attorney, Agent, or Firm*—Westerman, Hattori, Daniels & Adrian, LLP.

(57) ABSTRACT

A multilayer interconnection structure of a semiconductor device includes a first guard ring extending continuously along a periphery of a substrate and a second guard ring extending continuously in the multilayer interconnection structure along the periphery so as to be encircled by the first guard ring and so as to encircle an interconnection pattern inside the multilayer interconnection structure, wherein the first and second guard rings are connected with each other mechanically and continuously by a bridging conductor pattern extending continuously in a band form along a region including the first and second guard rings when viewed in the direction perpendicular to the substrate.

5 Claims, 10 Drawing Sheets

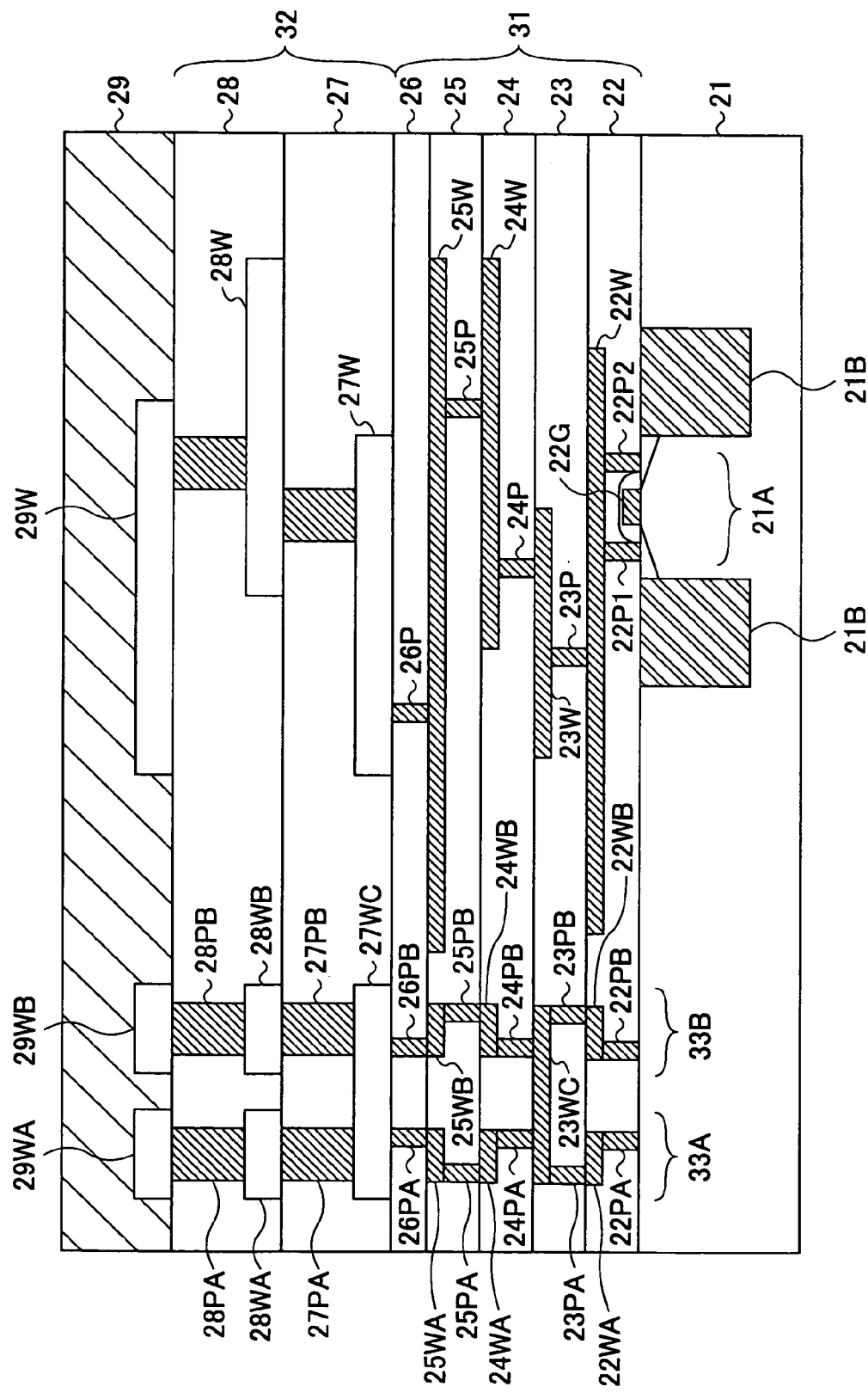

SEMICONDUCTOR DEVICE HAVING A GUARD RING

CROSS-REFERENCE TO RELATED APPLICATION

The present application is based on Japanese priority application No. 2003-088139 filed on Mar. 27, 2003, the entire contents of which are hereby incorporated by reference.

BACKGROUND OF THE INVENTION

The present invention generally relates to semiconductor devices and more particularly to a semiconductor device having a multilayer interconnection structure.

Conventionally, increase of operational speed has been attempted in semiconductor devices by way of device miniaturization according to the scaling law. On the other hand, in recent semiconductor integrated circuits of high integration density, it is insufficient to use a single interconnection layer for wiring semiconductor devices of enormous numbers formed on the substrate, and thus, a multilayer interconnection structure in which a number of interconnection layers are stacked with intervening insulation films is used generally for providing the necessary interconnection.

In the semiconductor integrated circuit having such a multilayer interconnection structure, on the other hand, it is practiced to provide an anti-moisture guard ring (referred to hereinafter simply as "guard ring") along a periphery of a chip so as to block penetration of moisture or gas. Such a guard ring extends in the multilayer interconnection structure continuously along the periphery of the chip and interrupts the penetration path of moisture or gas, which may be formed at the interface between an interlayer insulation film and an interconnection layer.

FIGS. 1A and 1B show the construction of a semiconductor integrated circuit 10 having such a conventional guard ring, wherein FIG. 1A is a cross-sectional view of the foregoing semiconductor integrated circuit 10 including a guard ring 1, while FIG. 1B is a plane view showing the entirety of the chip of the semiconductor integrated circuit 10.

Referring to FIG. 1A, the semiconductor integrated circuit 10 is formed on a device region 11A defined on a Si substrate 11 by a device isolation structure 11B and includes active devices such as a MOS transistor formed on the device region 11A.

The semiconductor integrated circuit 10 includes a first multilayer interconnection structure 12 formed on the substrate and includes therein interconnection layers L1-L4 and via-plugs P1-P6 and a second multilayer interconnection structure 13 formed on the first multilayer interconnection structure 12, wherein the second multilayer interconnection structure 13 includes therein interconnection layers L5-L7 and via-plugs P7 and P8. In FIG. 1, it should be noted that illustration of the interlayer insulation films in the multilayer interconnection structures 12 and 13 is omitted.

Further, as shown in the plan view of FIG. 1B, a guard ring 14 is formed on the substrate 11 continuously along the periphery of the chip.

Referring to FIG. 1A again, the guard ring 14 is formed by stacking conductor patterns C1-C7 extending continuously along the periphery of the chip respectively in correspondence to the interconnection layers L1-L7 and conductor walls W1-W7 also extending continuously along the periphery of the chip respectively in correspondence to plugs P1a and P1b and also the plugs P2-P7.

Such a guard ring 14 has a layered structure corresponding to the multilayer interconnection structures 12 and 13 and thus can be formed at the time of formation of the multilayer interconnection structure by a common process.

SUMMARY OF THE INVENTION

One object of the present invention is to provide a semiconductor device having a guard ring capable of blocking invasion of moisture or gas into the semiconductor device from outside effectively and with reliability.

Another object of the present invention is to provide a semiconductor device having a guard ring occupying a small area and yet capable of blocking invasion of moisture or gas into the semiconductor device effectively and with reliability.

Another object of the present invention is to provide a semiconductor device, comprising:

a substrate; and a multilayer interconnection structure formed on said substrate, said multilayer interconnection structure comprising:

a first guard ring extending continuously in said multilayer interconnection structure along a periphery of said substrate;

a second guard ring extending continuously in said multilayer interconnection structure along said periphery so as to be encircled by said first guard ring, said second guard ring encircling an interconnection pattern inside said multilayer interconnection structure;

said first and second guard rings being connected with each other mechanically and continuously by a bridging conductor pattern extending continuously in a band form along a region including said first and second guard rings, when viewed in the direction perpendicular to said substrate.

According to the present invention, the region between the first and second guard rings is compartmented by the bridging conductor pattern extending continuously along the band form region between the first and second guard rings when viewed in the direction perpendicular to the substrate. Thus, even in the case moisture or gas has invaded to such a region, further penetration of the moisture or gas to the interior of the semiconductor device is blocked by the foregoing bridging conductor pattern. Thereby, the bridging conductor pattern functions as a compartment wall or a bulkhead. Thus, according to the present invention, by using the two guard rings, invasion of moisture or gas is blocked positively while suppressing the increase of area of the substrate surface occupied by the guard ring.

Another object of the present invention is to provide a semiconductor device, comprising:

a substrate;

a first multilayer interconnection structure formed on said substrate;

a second multilayer interconnection structure formed on said first multilayer interconnection structure, said first multilayer interconnection structure comprising: a first guard ring extending continuously in said first multilayer interconnection structure along a periphery of said substrate; and a second guard ring extending continuously in said first multilayer interconnection structure along said periphery so as to be encircled by said first guard ring, said second guard ring encircling an interconnection pattern inside said first multilayer interconnection structure, said second multilayer interconnection structure comprising: a bridging conductor pattern extending in said second multilayer interconnection structure over a band form region continuously, said bridging conductor pattern mechanically connecting said first and second guard rings with each other; and a third guard ring formed on said bridging conductor pattern.

According to the present invention, the area of the substrate occupied by the first and second guard rings is minimized by connecting the first and second guard rings formed in the first multilayer interconnection structure to the third guard ring formed in the second multilayer interconnection structure by way of the bridging conductor pattern.

In the semiconductor device of the present invention, a very minute interconnection pattern is formed in the first multilayer interconnection structure of the lower layer by using a stringent design rule, and associated with this, the first and second guard rings are formed by a minute pattern with minute pitch or minute interval. Contrary to this, the design rule is less stringent in the second multilayer interconnection structure of the upper layer where a large via-diameter is used. Thereby, the third guard ring is formed by a wide conductor wall having a comparatively large width in correspondence to the via-diameter. In the present invention, the area of the substrate surface occupied by the guard ring is minimized by providing the first and second guard rings right underneath the third guard ring. Of course, the reliability of the guard ring, and thus the reliability of the semiconductor device, can be improved furthermore by forming a different bridging conductor pattern in the first multilayer interconnection structure so as to bridge the first and second guard rings.

Other objects and further features of the present invention will become apparent from the following detailed description when read in conjunction with the attached drawings.

BRIEF DESCRIPTION OF THE DRAWINGS

FIG. 8 is a diagram showing a modification of the semiconductor integrated circuit of FIG. 3;

DETAILED DESCRIPTION OF THE INVENTION

In recent ultrafine semiconductor integrated circuits, low dielectric constant films called low-K film having a low specific dielectric constant is used as the interlayer insulation film for suppressing the problem of parasitic capacitance of wiring. It should be noted that parasitic capacitance of wiring becomes conspicuous with the progress of device miniaturization and becomes a serious problem in high-density integrated circuits. Such a low dielectric constant film includes those films having a specific dielectric constant of 2.0-3.0 or less, such as an aromatic hydrocarbon polymer film marketed under the trademark of SiLK or Flare, or a porous film thereof. Such a low dielectric constant film is used predominantly for the lower multilayer interconnection structure 12 located near the substrate 11, in which interconnection patterns are formed with minimum separation.

Such a low dielectric constant film generally has the feature of low density in correspondence to the feature of low specific dielectric constant, and because of this, various investigations and proposals have been made for a multilayer interconnection structure that uses a low dielectric constant interlayer insulation film in relation to securing adhesion between the interconnection pattern and the interlayer insulation film.

The similar situation applies also to the case of the guard ring 14, and thus, there can be a case in which gap is formed between any of the conductor patterns C1-C7 such as the conductor pattern C3 and the conductor wall formed adjacent thereto.

Figure 1A:
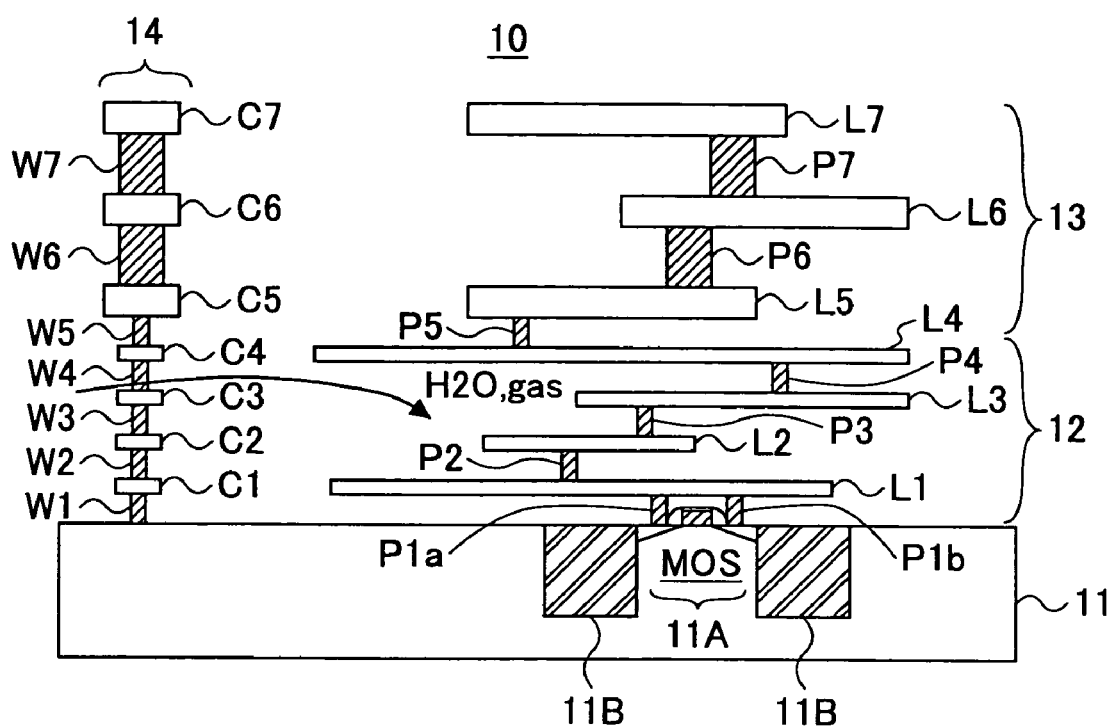
FIGS. 1A and 1B are diagrams showing the construction of a semiconductor integrated circuit having a conventional multilayer interconnection structure and a guard ring.

When a gap is formed in the guard ring, such a part can serve for the path of moisture or external gas into the multilayer interconnection structure. As shown in FIG. 1A, moisture or gas thus invaded can cause various problems such as defective contact, increase of resistance, disconnection of interconnection pattern, and the like, when it has caused diffusion into the multilayer interconnection structures 12 and 13. Further, in the case the moisture or gas thus invaded has reached the active device such as a MOS transistor formed on the surface of the substrate 11, there is a possibility that the active device may experience degradation.

Figure 1B:
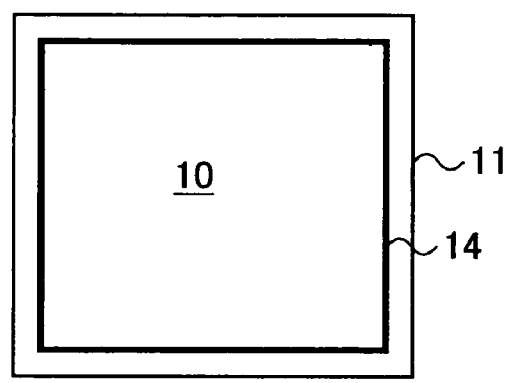
Figure 2:
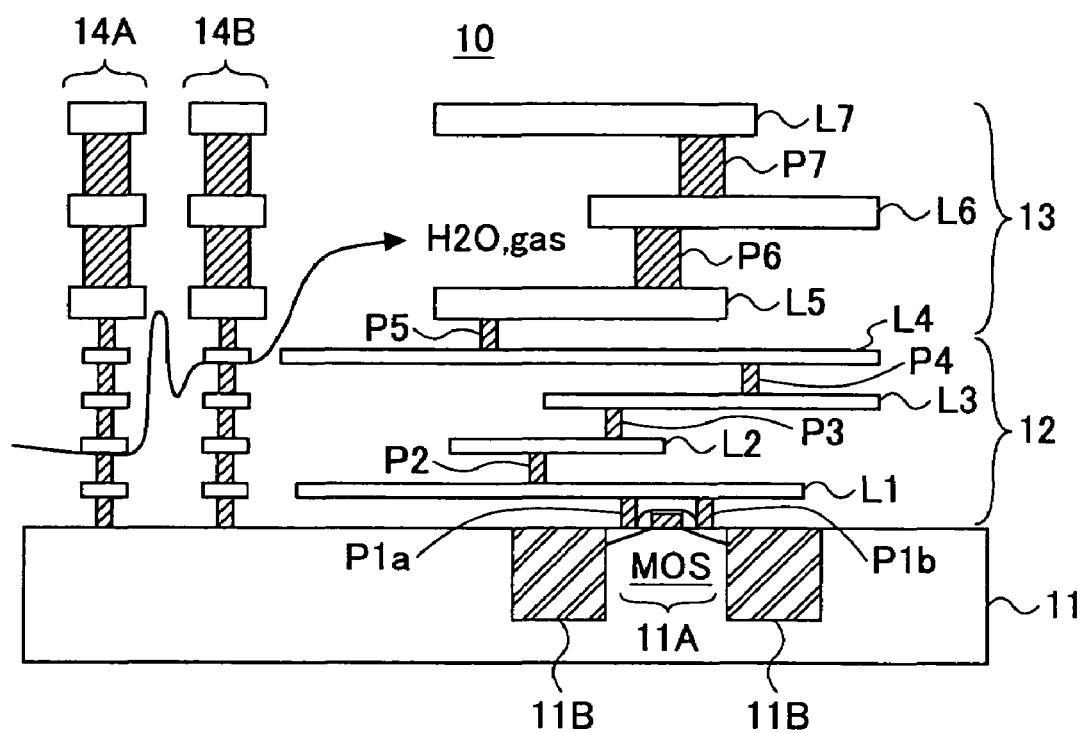
FIG. 2 is a diagram showing the construction of a semiconductor integrated circuit having a dual guard ring structure and further the problems caused in such a semiconductor integrated circuit.

In order to solve such problems, it has been practiced to provide a guard ring of double structure by using guard rings 14A and 14B as shown in FIG. 2, wherein those parts of FIG. 2 explained previously are designated by the same reference numerals and the description thereof will be omitted. In the illustrated example, the guard rings 14A and 14B have the same construction as the guard ring 14 of FIG. 1.

By using such a guard ring of double structure, the probability of invasion of moisture or gas into the multilayer interconnection structures 12 and 13 is reduced significantly.

In the construction of FIG. 2, however, the moisture or the gas invaded inside the guard ring 14A can cause diffusion in the stacked structure between the guard rings 14A and 14B in the case there is formed a defect somewhere in the outer guard ring 14A extending continuously along the chip periphery and in the case there is formed a defect somewhere in the inner guard ring 14B extending continuously along the chip periphery as shown in FIG. 2. Ultimately, the moisture or gas can enter the region inside the guard ring 14B.

Thus, there are cases in which the semiconductor integrated circuit having the guard ring of the double structure of FIG. 2 cannot satisfy the reliability and lifetime specified for the semiconductor integrated circuit.

Further, in the case of the semiconductor integrated circuit having the guard ring of the double structure of FIG. 2, the guard ring occupies substantial area of the substrate 11, and because of this, there arises the problem in that the area for forming the active device or the multilayer interconnection structure is decreased.

As explained previously, very minute interconnection patterns having the via-diameter of 0.9 μm or less, for example, are formed with close separation and thus with high density in the lower multilayer interconnection structure 12, by using a low dielectric interlayer insulation film. On the other hand, in the upper multilayer interconnection structure 13, the design rule for the interconnection pattern is less stringent, and thus, there are cases in which a via-diameter of about 1.7 μm is used.

In such a structure, the separation between the guard rings 14A and 14B is determined substantially by the via-diameter in the multilayer interconnection structure 13, and there appears a waste region in the multilayer interconnection structure 12 between the guard rings 14A and 14B in which formation of a functional element of the semiconductor device is not possible.

Further, it should be noted that an interlayer insulation film of low dielectric constant is generally a low density film as explained previously, and because of this, the low dielectric film generally shows poor mechanical performance such as poor Young modulus. Because of this, there is a tendency in the guard ring 14 of FIG. 1 that concentration of stress occurs in the conductor patterns C1-C4 or in the conductor walls W1-W5 corresponding to the lower multilayer interconnection structure 12 when an external stress is applied. Thereby, the conductor patterns C1-C4 or the conductor walls W1-W5 may easily undergo deformation. When deformation is caused in any of the conductor patterns C1-C4 or in the conductor walls W1-W5, there is formed an invasion path of moisture or external gas as explained previously.

FIRST EMBODIMENT

Figure 3:
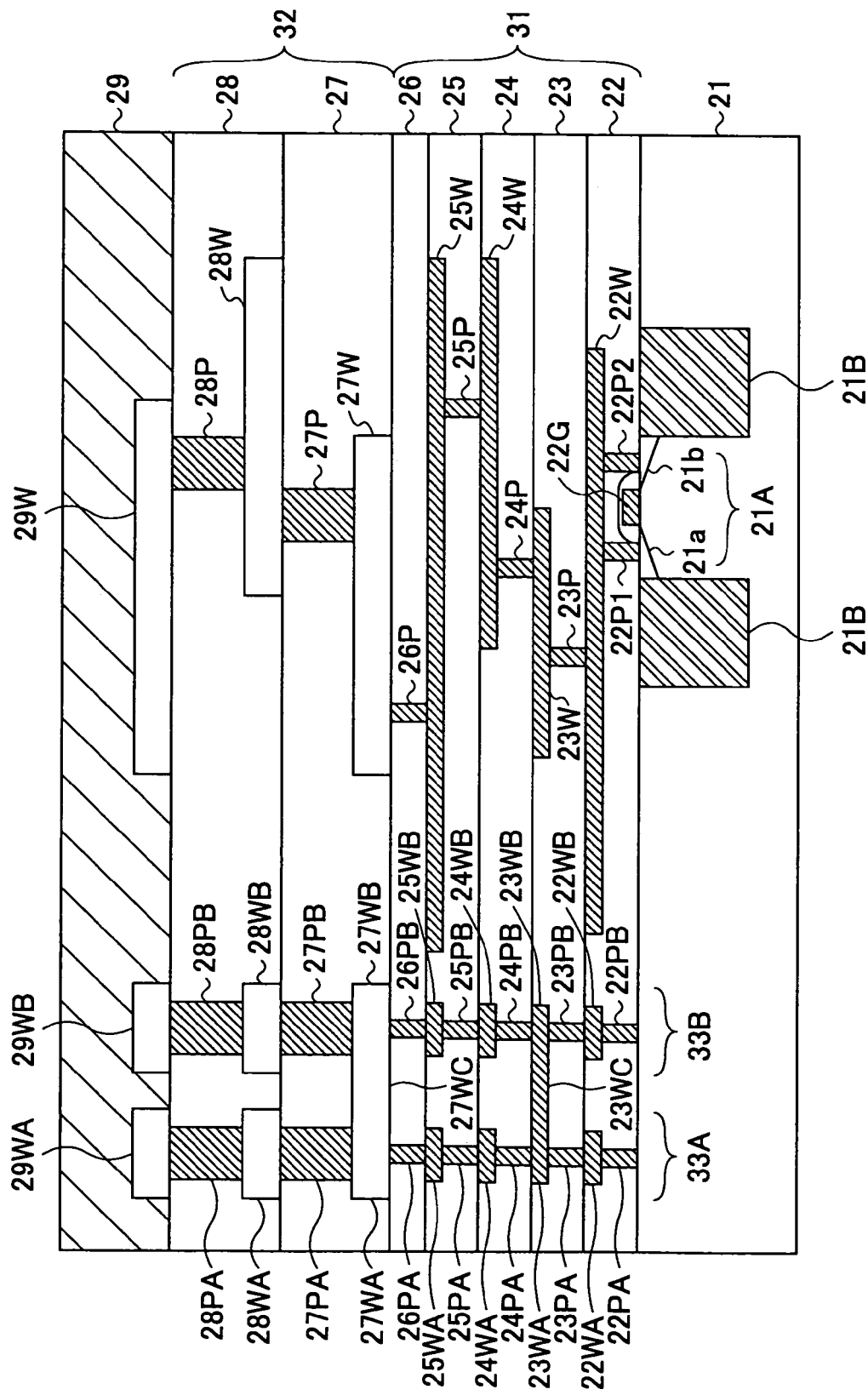
FIG. 3 is a diagram showing the construction of a semiconductor integrated circuit according to a first embodiment of the present invention.

FIG. 3 shows the construction of a semiconductor integrated circuit 20 according to a first embodiment of the present invention.

Referring to FIG. 3, the semiconductor integrated circuit 20 is formed on a Si substrate 21 having a device region 21A defined by a device isolation structure 21B, and a MOS transistor including a gate electrode 22G and diffusion regions 21a and 21b is formed in the device region 21A such that the diffusion regions 21a and 21b are formed in the Si substrate 21 at both lateral sides of the gate electrode 22G. In FIG. 3, it should be noted that illustration of the gate insulation film is omitted. Further, similarly to a usual MOS transistor, the gate electrode 22G is provided with a pair of sidewall insulation films of $SiO_2$ or SiON.

The gate electrode 22G is covered by an interlayer insulation film 22 formed on the substrate 21, wherein the interlayer insulation film 22 forms a part of the first multilayer interconnection structure 31 formed on the substrate 21.

Thus, on the interlayer insulation film 22, interlayer insulation films 23-26 are formed consecutively, and an interconnection pattern 22W and via-plugs $22P_1$, and $22P_2$ are formed in the interlayer insulation film 22 so as to fill the wiring groove or via-holes formed in the film 22 by way of a dual damascene process, by filling the wiring grooves or via-holes by a conductor layer and by removing the unnecessary conductor layer on the interlayer insulation film 22 by a CMP (chemical mechanical polishing) process. As a result of the dual damascene process, the interconnection pattern 22W has a principal surface coincident to the surface of the interlayer insulation film 22. Further, in the illustrated example, the via-plugs $22P_1$, and $22P_2$ make a contact to the diffusion regions 21a and 21b, respectively.

A similar interconnection structure is formed in each of the interlayer insulation films 23-26. Thus, in the interlayer insulation film 23, there are formed an interconnection layer 23W and a via-plug 23P, while an interconnection layer 24W and a via-plug 24P are formed in the interlayer insulation film 24. Further, an interconnection layer 25W and a via-plug 25P are formed in the interlayer insulation film 25 and a via-plug 26P is formed in the interlayer insulation film 26.

Typically, the interlayer insulation films 23-26 are formed of an organic polymer film having a specific dielectric constant of less than 3.0, while the interconnection layers 22W-25W and the via-plugs $22P_1$, and $22P_2$ and 23P-26P are formed of Cu. Further, the interconnection layers 22W-25W and the via-plugs $22P_1$, and $22P_2$ and 23P-26P can be formed also by using Al or an Al alloy or other conductors.

On the interlayer insulation film 26, there is formed an interconnection layer 27W typically formed of Al or an Al alloy so as to make a contact with the via-plug 26P, wherein the interconnection layer 27W forms a part of another multilayer interconnection structure 32 formed on the multilayer interconnection structure 31.

Thus, the interconnection layer 27W is covered with an interlayer insulation film 27 and a next interconnection layer 28W is formed on the interlayer insulation film 27. The interconnection layer 28W, in turn, is connected to the interlayer insulation film 27 through a via-plug 27P formed in the interconnection layer 27W. Similarly, the interconnection layer 28W is covered with an interlayer insulation film 28 formed on the interlayer insulation film 27, and a next interconnection layer 29W is formed on the interlayer insulation film 28. The interconnection layer 29W is connected to the interconnection layer 28W through a via-plug 28P formed in the interlayer insulation film 28.

In a typical example, the interlayer insulation films 27 and 28 are formed of SiOC or $SiO_2$ while the interconnection layers 27W-29W are formed of Al or an Al alloy. Further, the via-plugs 27P and 28P are formed by W (tungsten), and the like.

Furthermore, a passivation film 29 of SiN, and the like, is formed on the interlayer insulation film 28.

In the semiconductor integrated circuit 20 of FIG. 3, an outer guard ring 33A and an inner guard ring 33B are formed so as to extend continuously along the periphery of the substrate such that the interconnection layers in the multilayer interconnection structures 31 and 32 are encircled. Reference should be made to the plan view of FIG. 1B.

Referring to FIG. 3, the guard ring 33A includes: a conductor wall 22PA formed in the interlayer insulation film 22 simultaneously to the via-plugs $22P_1$, and $22P_2$ by the same material thereto so as to extend in the interlayer insulation film 22 continuously along a periphery of the substrate 21 without forming a gap with a width substantially the same as the diameter of the via-plugs; and a conductor pattern 22WA formed in the interlayer insulation film 22 simultaneously to the interconnection layer 22W by the same material thereto so as to extend on the conductor wall 22PA continuously along the periphery of the substrate without forming a gap. Further, in the interlayer insulation film 23, there are formed, as a part of the guard ring 33A, a conductor wall 23PA extending on the conductor pattern 22WA continuously along the periphery of the substrate 21 without forming a gap with a width substantially the same as the diameter of the via-plug 23P, and a conductor pattern 23WA extending on the conductor wall 23PA along the substrate periphery continuously without forming a gap, wherein the conductor wall 23PA is formed simultaneously to the via-plug 23P by the same material, while the conductor pattern 23WA is formed in the interlayer insulation film 23 simultaneously to the interconnection layer 23W by the same material.

Further, the guard ring 33A includes: a conductor wall 24PA formed in the interlayer insulation film 24 simultaneously to the via-plug 24P by the same material thereto so as to extend on the conductor pattern 23WA continuously along the periphery of the substrate 21 with substantially the same width as the diameter of the via-plug 24P without forming a gap; a conductor pattern 24WA formed in the interlayer insulation film 24 simultaneously to the interconnection layer 24W by the same material so as to extend on the conductor wall 24PA continuously along the substrate periphery without forming a gap; a conductor pattern 25WA formed in the interlayer insulation film 25 simultaneously to the interconnection layer 25W by the same material thereto so as to extend on the conductor wall 24PA continuously along the periphery of the substrate without forming a gap; and a conductor wall 25PA formed in the interlayer insulation film 25 simultaneously to the via-plug 25P by the same material thereto so as to extend on the conductor pattern 24WA with a width the substantially the same width as the via-diameter of the via-plug 25P continuously along the periphery of the substrate 21 without forming a gap.

In the interlayer insulation film 25, there is formed a conductor pattern 25WA formed simultaneously to the interconnection layer 25W by the same material such that the conductor pattern 25WA extends on the conductor wall 25PA continuously without forming a gap.

Further, the guard ring 33A includes a conductor wall 26PA formed simultaneously to the via-plug 26P by the same material thereto so as to extend continuously in the interlayer insulation film 26 on the conductor pattern 25WA with substantially the same width as the diameter of the via-plug 26P along the periphery of the substrate 21 without forming a gap. The guard ring 33A further includes, on the conductor wall 26PA, a conductor pattern 27WA formed in the interlayer insulation film 27 simultaneously to the interconnection layer 27W by the same material thereto so as to extend on the conductor wall 26PA along the substrate periphery continuously without forming a gap, and a conductor wall 27PA formed simultaneously to the via-plug 27P by the same material thereto so as to extend on the conductor pattern 27WA along the periphery of the substrate circumference continuously without forming a gap.

Further, the guard ring 33A includes: a conductor pattern 28WA formed on the conductor wall 27PA in the interlayer insulation film 27 simultaneously to the interconnection layer 28W by the same material thereto so as to extend on the conductor wall 26PA continuously along the periphery of the substrate without forming a gap; and a conductor wall 28PA formed simultaneously to the via-plug 28P by the same material thereto so as to extend on the above-mentioned conductor pattern 28WA continuously along the periphery of the substrate without forming a gap. Further, in the passivation film 29, there is formed a conductor pattern 29WA on the conductor wall 28PA simultaneously to the interconnection layer 29W by the same material as a part of the guard ring 33A.

Similarly, the guard ring 33B includes: a conductor wall 22PB formed in the interlayer insulation film 22 simultaneously to the conductor wall 22PA by the same material thereto so as to extend in the interlayer insulation film 22 continuously along the periphery of the substrate 21 with a width substantially the same as the via-diameter of the via-plug $22P_1$, or $22P_2$ without forming a gap; and a conductor pattern 22WB formed in the interlayer insulation film 22 simultaneously to the conductor pattern 22WA by the same material thereto so as to extend on the conductor wall 22PB continuously along the periphery of the substrate without forming a gap. Further, in the above-mentioned interlayer insulation film 23, there are provided, as a part of the guard ring 33B, a conductor wall 23PB formed simultaneously to the conductor wall 23PA by the same material thereto so as to extend on the conductor pattern 22WB continuously along the periphery of the substrate 21 with a width substantially the same as the diameter of the via-plug 23P without forming a gap, and a conductor pattern 23WB formed in the interlayer insulation film 23 simultaneously to the conductor pattern 23WA by the same material so as to extend on the conductor wall 23PB along the periphery of the substrate continuously without forming a gap.

Further, the guard ring 33B includes: a conductor wall 24PB formed in the interlayer insulation film 24 simultaneously to the conductor wall 24PA by the same material thereto so as to extend on the conductor pattern 23WB along the periphery of the substrate 21 continuously with a width substantially the same as the diameter of the via-plug 24P without forming a gap; and a conductor pattern 24WB formed in the interlayer insulation film 24 simultaneously to the conductor pattern 24WA by the same material thereto so as to extend on the conductor wall 24PB top along the periphery of the substrate continuously without forming a gap. Further, the guard ring 33B includes a conductor pattern 25WB formed in the interlayer insulation film 25 simultaneously to the conductor pattern 25WA with the same material thereto so as to extend on the conductor wall 24PB continuously along the periphery of the substrate without forming a gap, and a conductor wall 25PB formed in the interlayer insulation film 25 simultaneously to the conductor wall 25PA by the same material thereto so as to extend on the conductor pattern 24WB along the periphery of the substrate 21 with a width substantially the same as the diameter of the via-plug 25P continuously without forming a gap.

In the interlayer insulation film 25, there further extends a conductor pattern 25WB formed simultaneously to the conductor pattern 25WA by the same material thereto on the conductor wall 25PB continuously without forming a gap.

Further, the guard ring 33B includes a conductor wall 26PB formed simultaneously to the conductor wall 26PA by the same material thereto in the interlayer insulation film 26 so as to extend on the conductor pattern 25WB along the periphery of the substrate 21 continuously a width the same as the diameter of the via-plug 26P without forming a gap. Further, the guard ring 33B includes a conductor pattern 27WB formed on the conductor wall 26PB in the interlayer insulation film 27 simultaneously to the conductor pattern 27WA by the same material thereto so as to extend on the conductor wall 26PB along the periphery of the substrate continuously without forming a gap, and a conductor pattern 27PB formed simultaneously to the conductor wall 27PA by the same material thereto so as to extend on the conductor pattern 27WB continuously along the periphery of the substrate without forming a gap.

Furthermore, the guard ring 33B includes: a conductor pattern 28WB formed on the conductor wall 26PB in the interlayer insulation film 27 simultaneously to the conductor pattern 28WA by the same material thereto so as to extend on the conductor wall 27PB continuously along the periphery of the substrate without forming a gap; and a conductor wall 28PB formed simultaneously to the conductor wall 28PA by the same material thereto so as to extend on the conductor pattern 28WB along the periphery of the substrate continuously without forming a gap. Further, in the passivation film 29, there is formed a conductor pattern 29WB on the conductor wall 28PB as a part of the guard ring 33B, simultaneously to the interconnection layer 29W by the same material thereto.

Figure 4:
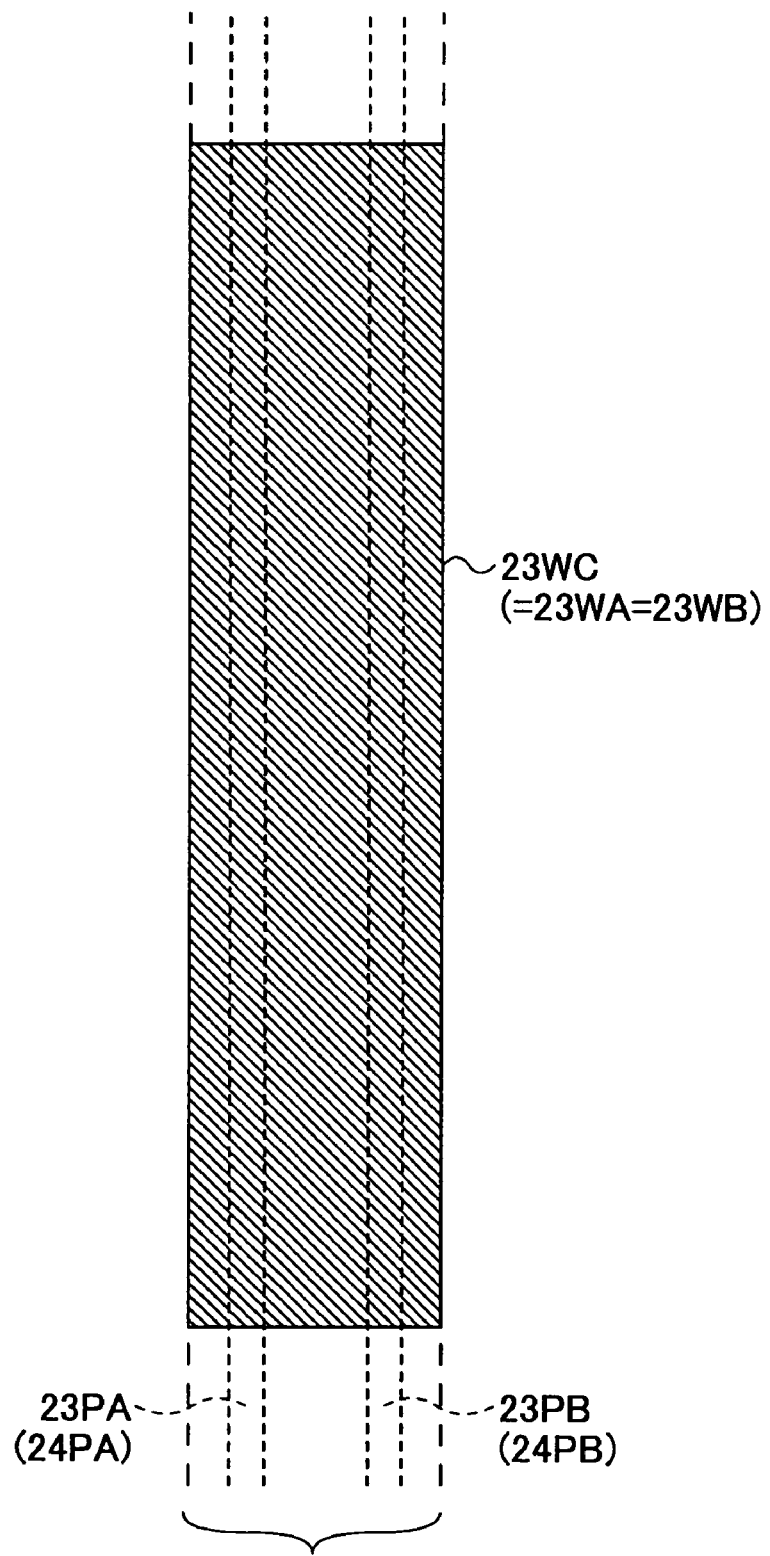
FIG. 4 is a plan view showing a part of FIG. 3 with an enlarged scale.

Thereby, as can be seen in FIG. 3, the conductor pattern 23WA and the conductor pattern 23WB are connected, and there is formed a conductor pattern 23WC extending continuously along the periphery of the substrate 11 as shown in FIG. 4. Similarly, the conductor pattern 27WA and the conductor 27WB are connected, and there is formed a conductor pattern 27WC extending continuously along the periphery of the substrate 11 similarly to FIG. 4. Thus, the conductor pattern 23WC and the conductor pattern 27C thus formed bridges across the guard ring 33A and the guard ring 33B.

As can be seen in FIG. 4, the conductor pattern 23WC extends continuously without forming a gap, and thus, there is formed no opening, and the like. Further, as shown in FIG. 4 by a dotted line, the upper and lower conductor walls 23PA and 23PB of the conductor pattern 23WC extend continuously along the periphery of the substrate 21 without forming a gap.

Figure 5:
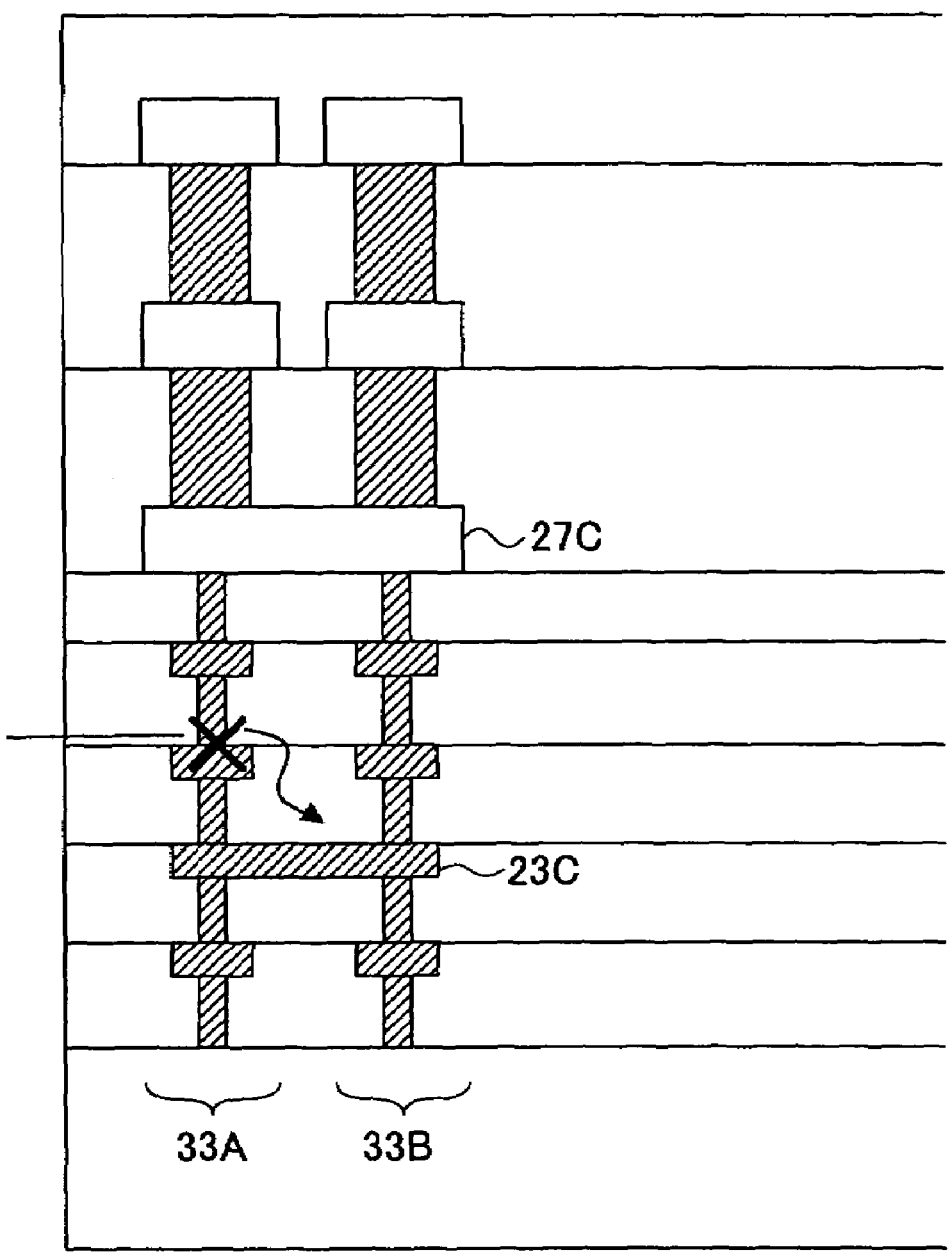
FIG. 5 is a diagram explaining the function of the guard ring in the semiconductor integrated circuit of FIG. 3.

In the construction of FIG. 3, it should be noted that, even in the case there is formed a defect x in a part of the guard ring 33A and also in the guard ring 33B as shown in FIG. 5, moisture or gas invaded from outside is blocked by the bridging conductor pattern 23 C as long as the defect is formed in the region isolated by the bridging conductor pattern 23C and cannot invade further into the region inside the guard ring 33B. In other words, the bridging conductor pattern 23C or 27C of the present embodiment functions as a bulkhead or compartment wall compartmenting the region between guard ring 33A and the guard ring 33B into plural compartments.

Figure 6:
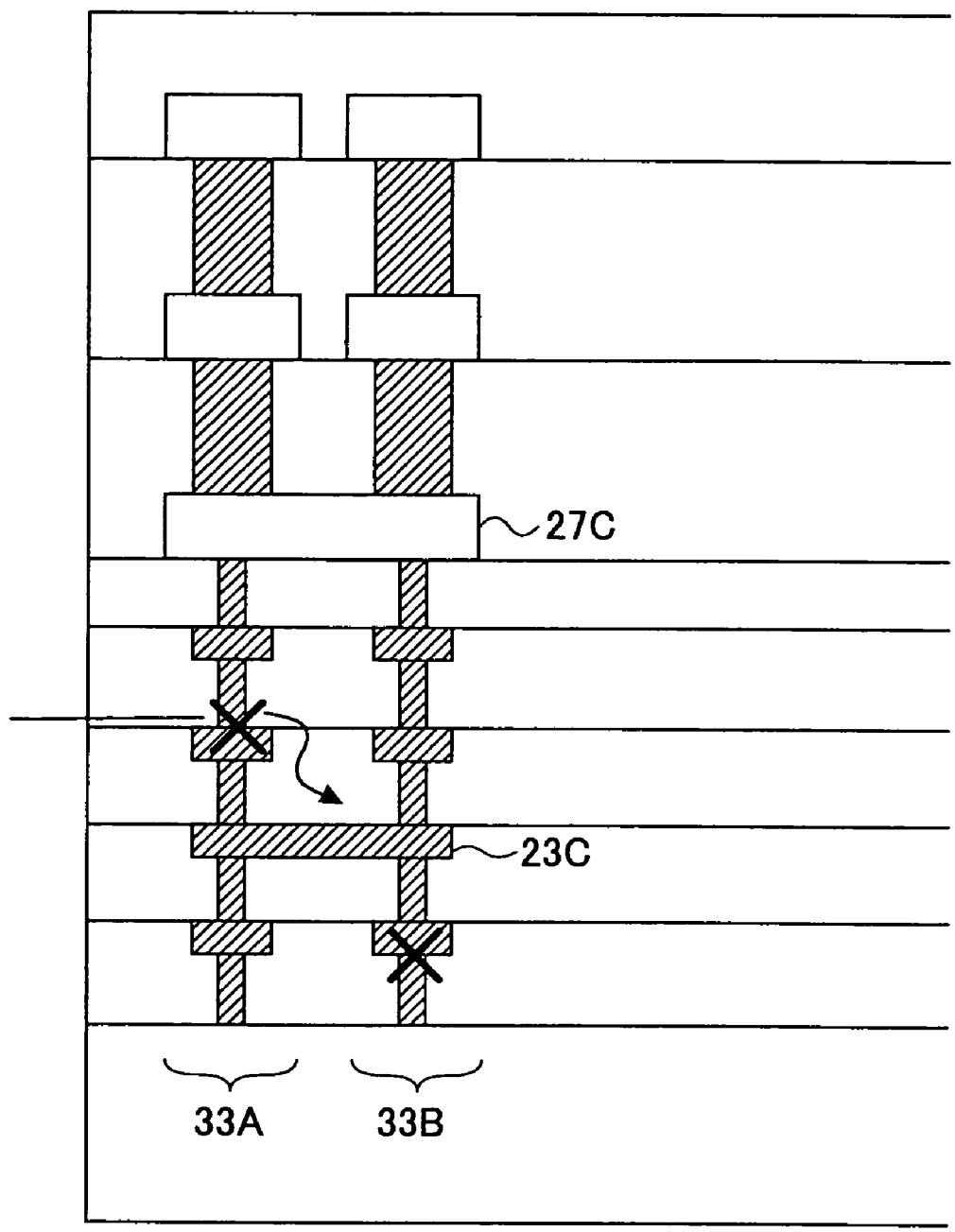
FIG. 6 is another diagram explaining the function of the guard ring in the semiconductor integrated circuit of FIG. 3.

Further, as shown in FIG. 6 the path of the external moisture or gas invading into the region inside the guard ring 33B can be blocked by using the conductor pattern 23C even in the case there exists a defect x in each of the guard rings 33A and 33B as long as the defects are formed in the different regions isolated by the bridging conductor pattern 23C. Thus, the reliability of the semiconductor device can be improved significantly. Contrary to this, in the case the guard ring has the structure of FIG. 2, the invasion path cannot be blocked and external moisture or gas can penetrate easily to the interior of the semiconductor integrated circuit.

Figure 7A:
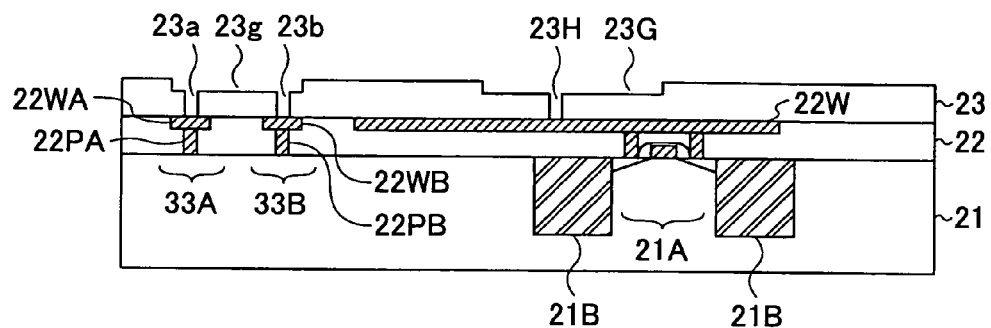
FIGS. 7A-7C are diagrams explaining the fabrication process of the guard ring used in the semiconductor integrated circuit of FIG. 3.
Figure 7B:
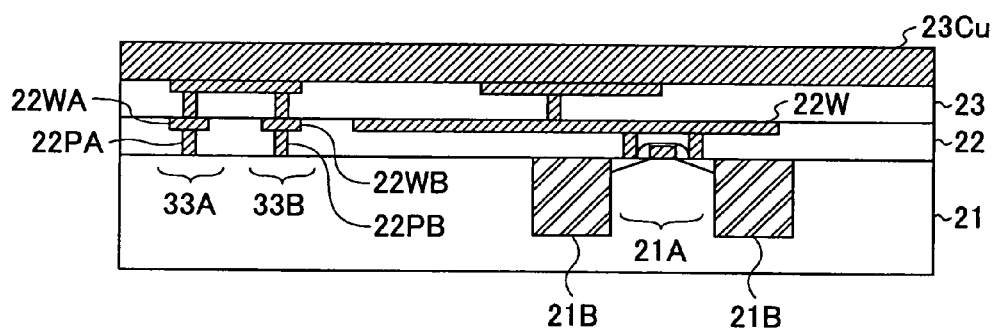
Figure 7C:
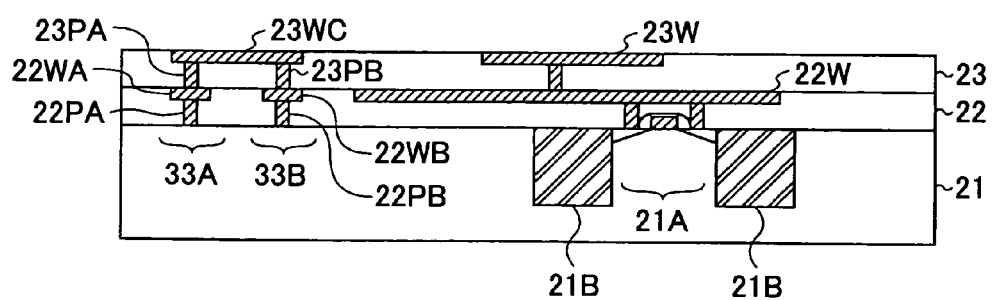

FIGS. 7A-7C show a part of the process of forming the guard rings 33A and 33B of FIG. 3.

Referring to FIG. 7A, the interlayer insulation film 22 is formed with the interconnection layer 22W, and the conductor pattern 22WA and the conductor wall 22PA are formed further in correspondence to the guard ring 33A. Further, the conductor wall 22PB and the conductor pattern 22WB are formed in correspondence to the guard ring 33B. The next interlayer insulation film 23 is then formed on the interlayer insulation film 22. Next, the conductor pattern 23A and the via-plug 23P are formed in the interlayer insulation film 23 respectively for the wiring groove 23G and for the via-hole 23H. Simultaneously to this, a groove 23g for the bridging conductor pattern 23C and the grooves 23a and 23b for the conductor walls 23PA and 23PB are formed in the interlayer insulation film 23 in correspondence to the guard rings 33A and 33B.

Next, in the step of FIG. 7B, the surface of the interlayer insulation film 23 of FIG. 7A, including the wiring groove 23G, the via-hole 23H and the grooves 23a, 23b and, 23g, it covered with a barrier metal film such as TaN (not illustrated), and thereafter, the groove 23G, the via-hole 23H and the grooves 23a, 23b, 23g are filled with a conductor layer 23Cu such as Cu or W.

Further, in the step of FIG. 7C, unnecessary conductor layer 23Cu on the surface of the interlayer insulation film 23 is removed by a CMP (chemical mechanical polishing) process, and a structure in which the wiring groove 23G and the via-hole 23H are filled with the conductor layer 23W and the via-plug 23P respectively and the grooves 23a, 23b and 23g are filled with the conductor walls 23PA and 23PB and the conductor pattern 23WC respectively, is obtained.

By repeating such a process, it becomes possible to form the guard rings 33A and 33B without inviting increase of number of the process steps.

In the construction of FIGS. 7A-7C, it should be noted that the conductor walls 22PA-28PA or the conductor wall 22PB-28PB are formed in alignment in the direction perpendicular to the substrate 11. However, this is not a necessarily condition, and it is also possible to displace the position thereof within the extent of the conductor patterns 23WA-29WA as shown in the modification of FIG. 8. Further, the conductor walls 22PA-28PA or the conductor walls 22PB-28PB can be formed also in a zigzag form inside the extent of the conductor pattern 22WA-29WA or the conductor pattern 22WB-29WB, which extend in the band-like form along the substrate periphery when viewed in the direction perpendicular to the principal surface the substrate 11.

In the present embodiment, it should be noted that the interlayer insulation films 22-28 are not limited to the aromatic hydrocarbon polymer film such as SiLK and FLARE, but it is also possible to use various low dielectric constant films such as an MSQ (methyl silsesquioxane) film or a HOSP (hydrido-organic siloxane polymer) film, or a porous film thereof, for the interlayer insulation films 22-28.

Further, the interconnection layers 22W-25W and the via-plugs 22P-26P, and thus, the conductor patterns 22WA-25WA and 22WB-25WB, and further the conductor walls 22PA-26PA and 22PB-26PB, are not limited to Cu or W, but it is also possible to use Al or an Al alloy in place thereof.

SECOND EMBODIMENT

Figure 9:
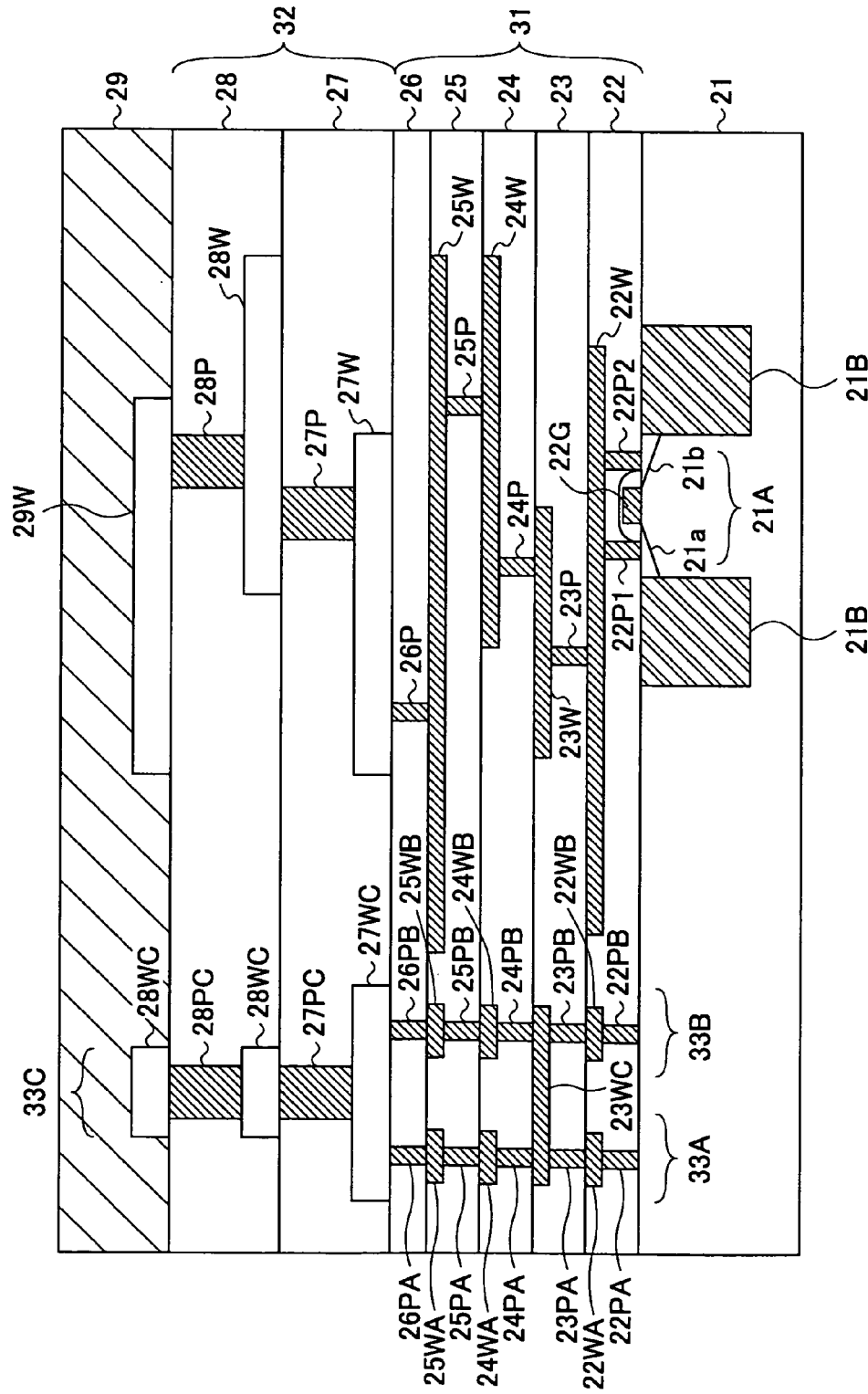
FIG. 9 is a diagram showing the construction of a semiconductor integrated circuit according to a second embodiment of the present invention.

FIG. 9 shows the construction of a semiconductor device 40 according to a second embodiment of the present invention, wherein those parts corresponding to the parts explained previously are designated by the same reference numerals and description thereof will be omitted.

Referring to FIG. 9, the interval between the guard ring 33A and the guard ring 33B on the substrate 21 is reduced in the present embodiment, and associated with this, there is formed, on the conductor pattern 27WC, a single guard ring 33C in the form of stacking of: a single conductor wall 27PC corresponding to the conductor plug 27P; a single conductor pattern 28WC corresponding to the interconnection layer 28W; a single conductor wall 28PC corresponding to the conductor plug 28P; and a single conductor pattern 29WC corresponding to the interconnection layer 29W.

As shown in FIG. 9, in the semiconductor device of the construction in which the multilayer interconnection structure 32 including therein an interconnection layer of Al or an Al alloy is provided on a high integration density multilayer interconnection structure 31 that uses a low dielectric constant interlayer insulation film by using an usual interlayer insulation film of SiOC or SiO$_2$, it should be noted that the interval between the guard rings 33A and 33B in the multilayer interconnection structure 31 of high integration density can be reduced by applying a stringent design rule of 0.9 μm or less thereto.

With this, the area of the substrate surface occupied by the guard rings 33A and 33B is decreased in the multilayer interconnection structure 31, and the region usable for formation of the active devices and interconnection patterns is increased. Particularly, because the guard ring is formed along the periphery of the substrate or chip, a small decrease of interval of the guard rings 33A and 33B can provide a substantial effect for increasing the substrate area usable for formation of active elements or interconnection patterns.

Meanwhile, in the structure of FIG. 9, a more relaxed design rule is used in the multilayer interconnection structure 32 of the upper layer, and because of this, there is no decrease in the diameter of the via-plug 27P or 28P, and hence the width of the conductor wall 27PC or 28PC. Thus, as shown in FIG. 9, it becomes possible to form the guard ring 33A and 33B in the multilayer interconnection structure 31 so as to locate right underneath the guard ring 33C formed in the multilayer interconnection structure 32.

In such a structure, the guard ring 33C is supported by the guard rings 33A and 33B, and because of this, the stress applied to the guard ring 33C is shared by the guard rings 33A and 33B, and thus, the stress applied to each of the guard rings 33A and 33B formed in the interlayer insulation films 22-26 of low Young modulus is reduced. Associated with this, the occurrence of defects in the guard rings 33A and 33B. explained with reference to FIG. 5 is suppressed, and the reliability of the semiconductor device is improved.

Figure 10:
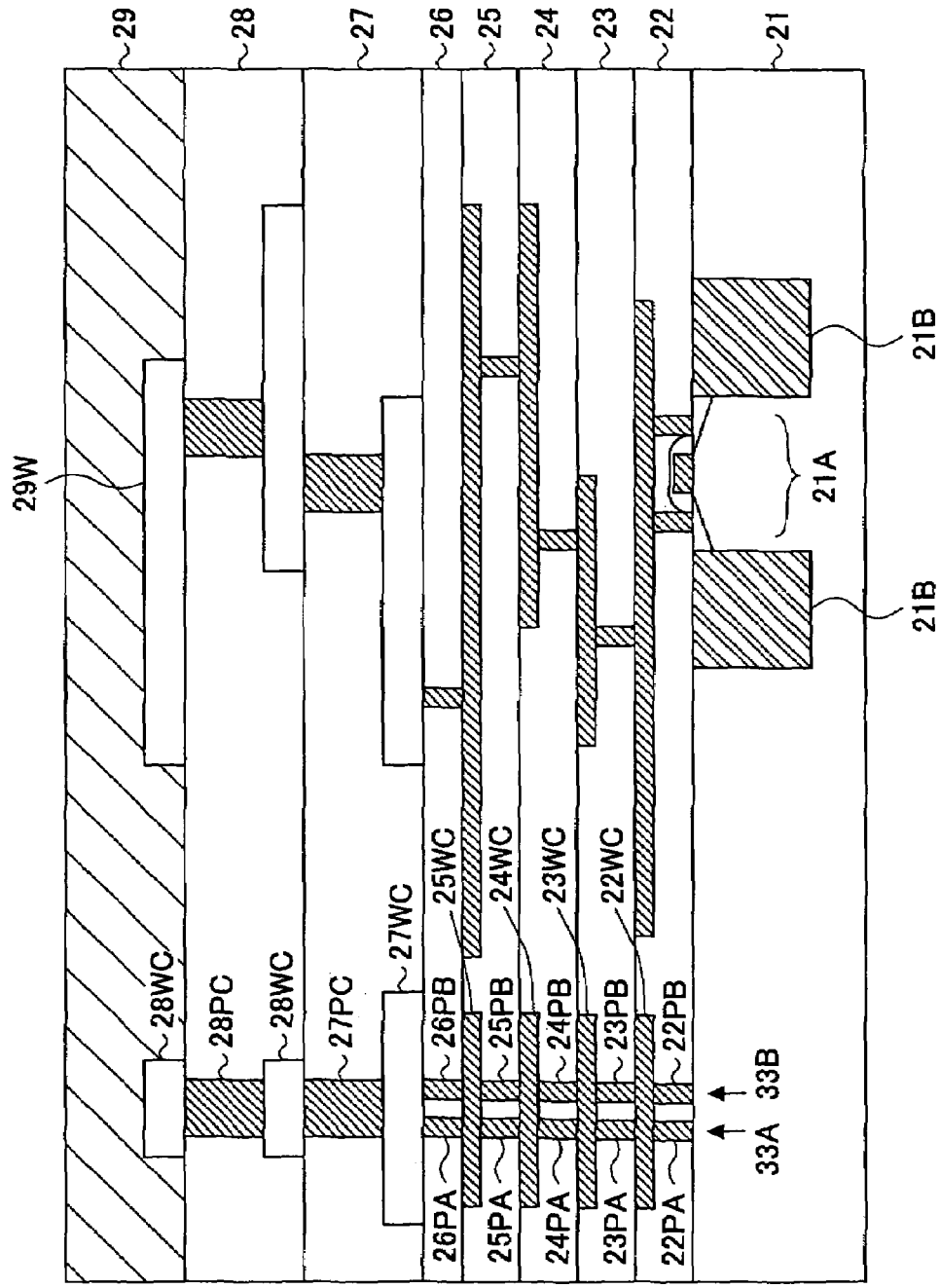
FIG. 10 is a diagram showing a modification of the semiconductor integrated circuit of FIG. 9.

FIG. 10 shows an example in which the interval between the guard ring 33A and the guard ring 33B is reduced in the semiconductor device 40 of FIG. 9 such that the interval between the conductor wall 22PA and the conductor wall 22PB is narrowed to the degree corresponding to the via-diameter.

Referring to FIG. 10, it should be noted that the guard ring is formed so as to bridge the conductor pattern in each the interlayer insulation films 22-25 in this case, and thus, the bridging conductor pattern 22WC bridges the conductor walls 22PA and 22PB in the interlayer insulation film 22. Similarly, the bridging conductor pattern 23WC bridges the conductor walls 23PA and 23PB in the interlayer insulation film 23, the bridging conductor pattern 24WC bridges the conductor walls 24PA and 24PB in the insulation film 24, and the bridging conductor pattern 25WC bridges the conductor walls 25PA and 25PB in the interlayer insulation film 25.

According to the construction of FIG. 10, the area occupied by the multiple guard ring structure in the high density multilayer interconnection structure formed above the substrate surface and also immediately on the substrate surface is minimized, and it becomes possible to form larger number of active devices or wiring structures on the substrate.

In the present embodiment, too, the interlayer insulation films 22-28 is not limited to the aromatic hydrocarbon polymer film such as SiLK or FLARE, similarly to the previous embodiment, and it is possible to use, for the interlayer insulation films 22-28, various low dielectric constant films such as an organo-siloxane film including an MSQ (methyl silsesquioxane) film, a HOSP (hydrido-organic siloxane polymer) film, and the like, or a porous film thereof.

Further, the interconnection layers 22W-25W, the via-plugs 22P-26P, and hence the conductor patterns 22WA-25WA, 22WB-25WB, and also the conductor walls 22PA-26PA and 22PB-26PB, are not limited to Cu and W, but it is also possible to use Al or an Al alloy in place thereof.

Further, the present invention is not limited to the embodiments described heretofore, but various variations and modifications may be made without departing from the scope of the invention.

What is claimed is:

1. A semiconductor device, comprising:
a semiconductor substrate; and
a multilayer interconnection structure formed on said semiconductor substrate,
said multilayer interconnection structure comprising:
a first guard ring extending continuously in said multilayer interconnection structure along a periphery of said semiconductor substrate; and
a second guard ring extending continuously in said multilayer interconnection structure along said periphery so as to be encircled by said first guard ring, said second guard ring encircling an interconnection pattern inside said multilayer interconnection structure;
said first and second guard rings being connected with each other mechanically and continuously by a bridging conductor pattern extending continuously in a band form along a region including said first and second guard rings, when viewed in the direction perpendicular to a principal surface of said semiconductor substrate.

2. The semiconductor device as claimed in claim 1, wherein said bridging conductor pattern does not have any of a gap or an opening.

3. The semiconductor device as claimed in claim 1, wherein said bridging conductor pattern is provided at plural different positions having different heights as measured from a surface of said semiconductor substrate.

4. The semiconductor device as claimed in claim 1, wherein said bridging conductor pattern is formed in one or more interlayer insulation films in said multilayer interconnection structure.

5. The semiconductor device as claimed in claim 1, wherein said multilayer interconnection structure has a layered structure in which a plurality of interlayer insulation films each including an interconnection layer corresponding thereto are stacked, and wherein an interconnection layer formed in one interlayer insulation film of said plural interlayer insulation films is connected to an underlying interconnection layer by a via-plug, each of said first and second guard rings having a layered structure identical to that of said multilayer interconnection structure, said bridging conductor pattern being formed at a height identical to that of the interconnection layer in said interlayer insulation film in which said bridging conductor pattern is formed.

* * * * *